United States Patent
Lavine et al.

(10) Patent No.: US 10,713,919 B2
(45) Date of Patent: Jul. 14, 2020

(54) LASER DAMAGE DETECTION MECHANISMS FOR SAFETY INTERLOCK AND FAULT DETECTION

(71) Applicant: Raytheon Company, Waltham, MA (US)

(72) Inventors: Jason R. Lavine, McKinney, TX (US); Liam T. Skoyles, Allen, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/192,491

(22) Filed: Nov. 15, 2018

(65) Prior Publication Data

US 2020/0160689 A1  May 21, 2020

(51) Int. Cl.
| | | |
|---|---|---|
| *G08B 21/00* | (2006.01) | |
| *G08B 21/18* | (2006.01) | |
| *G01R 31/44* | (2020.01) | |
| *G08B 5/36* | (2006.01) | |

(52) U.S. Cl.
CPC ............ *G08B 21/18* (2013.01); *G01R 31/44* (2013.01); *G08B 5/36* (2013.01)

(58) Field of Classification Search
CPC .......... G08B 21/18; G08B 5/36; G01R 31/44; G01R 19/00; G01R 23/02; H02H 3/06; G01J 1/02; G01J 2001/0285; F16P 3/144; B23K 26/705; B23K 26/702
USPC ...... 340/687, 686.1, 686.2, 693.5, 540, 550, 340/557; 374/6; 250/205, 214.1
See application file for complete search history.

(56) References Cited

U.S. PATENT DOCUMENTS

| | | | |
|---|---|---|---|
| 4,100,419 A | 7/1978 | Pedroso | |
| 4,223,248 A | 9/1980 | Tong | |
| 5,151,095 A | 9/1992 | Teeple, Jr. | |
| 5,453,664 A | 9/1995 | Harris | |
| 5,837,996 A | 11/1998 | Keydar | |
| 5,992,417 A | 11/1999 | Toepel | |
| 6,031,459 A * | 2/2000 | Lake | G06K 19/07728 340/5.61 |
| 6,479,762 B2 | 11/2002 | Kusaka | |
| 6,775,315 B1 | 8/2004 | Nield et al. | |
| 8,022,346 B2 | 9/2011 | Newman et al. | |
| 8,929,973 B1 | 1/2015 | Webb et al. | |
| 9,518,551 B2 | 12/2016 | Martin et al. | |
| 2006/0266920 A1 | 11/2006 | Pileri et al. | |

(Continued)

OTHER PUBLICATIONS

International Search Report and Written Opinion of the International Searching Authority in connection with International Patent Application No. PCT/US2019/039772 dated Oct. 18, 2019, 13 pages.

*Primary Examiner* — Anh V La (57) ABSTRACT

An apparatus includes a substrate and first and second electrical connectors. The apparatus also includes at least one first conductive trace positioned in, on, or over the substrate. The at least one first conductive trace forms an electrical connection between the first and second electrical connectors. The at least one first conductive trace is configured to be damaged by laser energy to break the electrical connection between the first and second electrical connectors. The apparatus further includes an indicator electrically coupled to the at least one first conductive trace. The indicator is configured to generate feedback based on whether the electrical connection between the first and second electrical connectors has been broken.

22 Claims, 6 Drawing Sheets

(56) References Cited

U.S. PATENT DOCUMENTS

| | | | |
|---|---|---|---|
| 2008/0001741 A1* | 1/2008 | Cobianu | B60R 25/1004 |
| | | | 340/568.2 |
| 2011/0292963 A1 | 12/2011 | Banfield et al. | |
| 2011/0316422 A1* | 12/2011 | Tischler | H05B 33/089 |
| | | | 315/90 |
| 2012/0169866 A1 | 7/2012 | Schmidt et al. | |
| 2012/0188078 A1* | 7/2012 | Soles | G08B 13/126 |
| | | | 340/540 |
| 2013/0154834 A1* | 6/2013 | Bucsa | H02H 3/087 |
| | | | 340/550 |
| 2014/0009952 A1 | 1/2014 | Nomura et al. | |
| 2014/0167738 A1* | 6/2014 | Makinson | H05K 1/0263 |
| | | | 324/126 |
| 2017/0353005 A1 | 12/2017 | Filgas et al. | |
| 2018/0013256 A1 | 1/2018 | Filgas et al. | |
| 2018/0085854 A1* | 3/2018 | Fissette | B23K 26/127 |

\* cited by examiner

LASER DAMAGE DETECTION MECHANISMS FOR SAFETY INTERLOCK AND FAULT DETECTION

TECHNICAL FIELD

This disclosure generally relates to high-energy laser systems. More specifically, this disclosure relates to laser damage detection mechanisms for safety interlock and fault detection.

BACKGROUND

High-energy laser systems are being developed for a number of commercial and defense-related applications. Unfortunately, it is not uncommon for a high-energy laser beam (or a portion thereof) to escape a high-energy laser system. This can be caused by a number of factors, such as misalignment of optical elements in the laser system. As a result, physical barriers are often positioned around a high-energy laser system (such as in a laboratory, test area, or other setting) or incorporated into the high-energy laser system itself (such as in a housing). Stray laser energy can strike the barriers and be converted into heat, which helps to protect nearby personnel from injury and helps to protect nearby equipment from damage. These barriers are often formed from materials such as graphite, aluminum, plastic, or steel.

SUMMARY

This disclosure provides laser damage detection mechanisms for safety interlock and fault detection.

In a first embodiment, an apparatus includes a substrate and first and second electrical connectors. The apparatus also includes at least one first conductive trace positioned in, on, or over the substrate. The at least one first conductive trace forms an electrical connection between the first and second electrical connectors. The at least one first conductive trace is configured to be damaged by laser energy to break the electrical connection between the first and second electrical connectors. The apparatus further includes an indicator electrically coupled to the at least one first conductive trace. The indicator is configured to generate feedback based on whether the electrical connection between the first and second electrical connectors has been broken.

In a second embodiment, a system includes one or more laser damage detectors each configured to detect stray laser energy from a laser. Each laser damage detector includes a substrate, first and second electrical connectors, at least one first conductive trace, and an indicator. The at least one first conductive trace is positioned in, on, or over the substrate. The at least one first conductive trace forms an electrical connection between the first and second electrical connectors. The at least one first conductive trace is configured to be damaged by the stray laser energy to break the electrical connection between the first and second electrical connectors. The indicator is electrically coupled to the at least one first conductive trace. The indicator is configured to generate feedback based on whether the electrical connection between the first and second electrical connectors has been broken. The system also includes a laser controller configured to shut down operation of the laser in response to breaking of the electrical connection between the first and second electrical connectors in at least one of the one or more laser damage detectors.

In a third embodiment, a method includes passing an electrical current through at least one first conductive trace of a laser damage detector. The at least one first conductive trace is positioned in, on, or over a substrate. The at least one first conductive trace forms an electrical connection between first and second electrical connectors. The method also includes generating feedback as the electrical current passes through the electrical connection between the first and second electrical connectors. The method further includes, in response to damage of the at least one first conductive trace by laser energy, stopping generation of the feedback, where the damage breaks the electrical connection between the first and second electrical connectors.

In a fourth embodiment, an apparatus includes a substrate and first and second electrical connectors. The apparatus also includes at least one first conductive trace positioned in, on, or over the substrate. The at least one first conductive trace forms an electrical connection between the first and second electrical connectors. The at least one first conductive trace is configured to be damaged by laser energy to break the electrical connection between the first and second electrical connectors.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

FIGS. 1 through 8, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

As noted above, it is often possible for a high-energy laser beam (or a portion thereof) to escape a high-energy laser system, such as when mirrors, lenses, or other optical elements in the system are misaligned. Barriers can be positioned around a high-energy laser system or incorporated into the high-energy laser system so that stray laser energy strikes the barriers, which helps to protect nearby personnel and equipment. Unfortunately, these barriers are typically very heavy and thick, so it can be difficult and expensive to incorporate these barriers into or around a laser system. Also, these barriers typically block viewing into an enclosed volume, which can prevent personnel from viewing the laser system itself. Because of this, it is often difficult or impossible for personnel to know if and when there is a misalignment or other fault that allows laser energy to escape a laser system.

In one approach, "burn strips" can be positioned around a laser system. Each burn strip generally includes a material that, when exposed to laser energy, changes color or is removed to expose a lower material having a different color or brightness. This allows the burn strips to be used to identify (after the fact) that laser energy escaped a laser system. However, burn strips are prone to failure and typically cannot be used to identify where a fault lies within a laser system. Also, burn strips cannot be used to automatically shut down a laser system when there is a fault, so operation of the laser system can continue even after stray laser energy strikes the burn strips.

In another approach, one or more infrared-sensing cameras can be used to sense when laser energy escapes a laser system. However, infrared-sensing cameras can often receive a significant amount of scattered light, which can interfere with proper operation of the infrared-sensing cameras. As a result, infrared-sensing cameras are often prone to generating "false positives," meaning the cameras detect stray laser energy when there is none. Because of this, there often needs to be a human operator monitoring the infrared-sensing cameras in order to verify whether stray laser energy has actually been detected and to shut down a laser system at an appropriate time. This can sometimes result in significant delays between the release of the stray laser energy and shutdown of the laser system.

This disclosure provides various laser damage detection mechanisms that can be used for safety interlock, fault detection, or other functions. Each laser damage detection mechanism generally includes one or more conductive traces formed in, on, or over a substrate. The substrate can represent a thin film, a fabric, a wall panel, a laser housing, or other suitable structure configured to carry or incorporate one or more conductive traces. For example, the conductive traces can be formed on panels that are mountable to walls or other structures around a given area, or the conductive traces can be integrated into or positioned around a laser housing. As particular examples, the conductive traces can be formed using three-dimensional (3D) printing on polyimide films or other substrates, or the conductive traces can be overlaid onto or inlayed into different portions of a laser housing. The one or more conductive traces can be wired in series with one or more light emitting diode (LED) indicators or other indicator or sensing devices that can generate visual feedback or other feedback.

When a high-energy laser beam (or a portion thereof) strikes a laser damage detection mechanism, the beam energy can burn through or melt at least one conductive trace of the laser damage detection mechanism. This interrupts or alters an electrical circuit formed using the conductive trace. In some embodiments, while the electrical circuit of a laser damage detection mechanism is intact, the LED indicator can generate illumination, or another indicator or sensing device can generate other feedback. This feedback allows personnel to know that the laser damage detection mechanism has not been damaged by laser energy. Damage from laser energy can break the electrical circuit, causing the illumination or other feedback to stop. The loss of feedback allows personnel to know that a fault has occurred and that the laser damage detection mechanism has been damaged by the laser energy. Also, interruption or alteration of the electrical circuit can be quickly detected by a control mechanism for the laser system, which can then shut down the laser system using an appropriate safety interlock. In addition, a bypass mechanism can be used in a damaged detection mechanism to restore current flow through the damaged detection mechanism, which allows other laser damage detection mechanisms coupled in series to continue operation.

In this way, one or more laser damage detection mechanisms can be used to support the shutdown of a laser system in response to detecting damage caused by stray beam energy. This can occur automatically and in an ultra-fast manner without requiring human intervention. Also, the size and pattern of the conductive traces in the laser damage detection mechanisms can be easily configured to prevent beams of certain diameters from escaping a given volume, which allows for easy tailoring of the laser damage detection mechanisms to support their use with various laser systems. Further, when conductive traces are formed on film or fabric substrates or other thin flexible substrates, the resulting structures are lightweight and easily conformed to match the surfaces of a laboratory, test area, or other area. Moreover, laser damage detection mechanisms implemented in this manner can be quickly and easily manufactured in various shapes and sizes, and they may be easily and cheaply replaced depending on the implementation. In addition, the LED indicators or other indicator or sensing devices can be used to quickly and easily identify where laser energy strikes laser damage detection mechanisms, and diagnostics can be performed to identify the conductive traces that failed for rapid troubleshooting.

Figure 1:
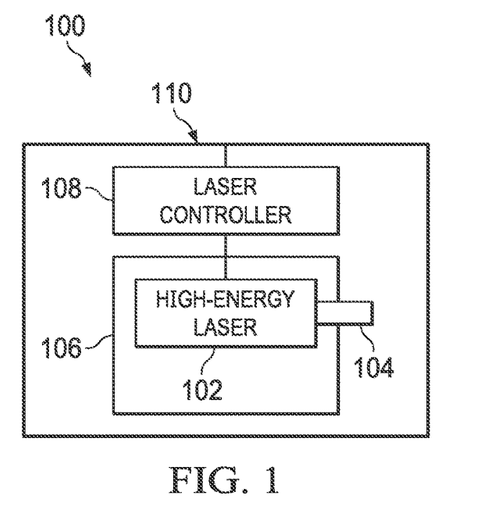
FIGS. 1 and 2 illustrate example systems having laser damage detection mechanisms for safety interlock and fault detection in accordance with this disclosure.
Figure 2:
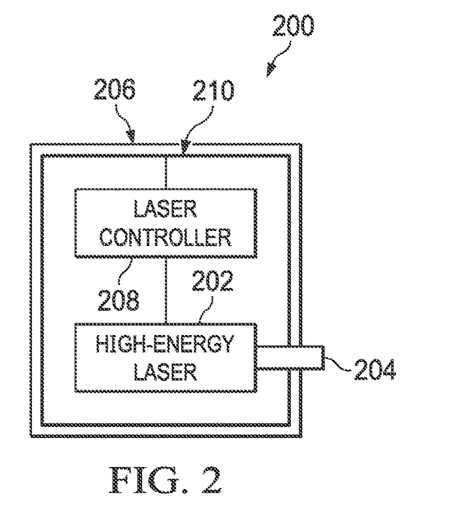

FIGS. 1 and 2 illustrate example systems 100 and 200 having laser damage detection mechanisms for safety interlock and fault detection in accordance with this disclosure. As shown in FIG. 1, the system 100 includes a high-energy laser 102, which generally operates to produce at least one high-energy laser beam 104. The laser 102 represents any suitable source configured to generate at least one high-energy beam. In some embodiments, for example, the laser 102 can be implemented as described in U.S. Patent Application Publication Nos. 2017/0353005 and 2018/0013256 (both of which are hereby incorporated by reference in their entirety). However, any other suitable high-energy laser 102 (now known or later developed) can be used in the system 100. The beam 104 represents any suitable high-energy laser beam having any suitable cross-sectional size and power level. In general, a "high-energy" beam can represent a beam having about ten kilowatts of power or more.

The laser 102 can be used in a number of commercial and defense-related applications. For example, the high-energy laser 102 can find use in commercial mining applications, such as in drilling, mining, or coring operations. For instance, the high-energy laser 102 can be used to soften or weaken an earth bed prior to drilling through the earth bed using drill bits. This can allow for fewer drill bit changes and extended lifetimes and reliabilities of the drill bits. Here, free-space propagation of the high-energy laser beam 104 from an output window of the laser 102 may be used, allowing deeper penetration at further distances compared to conventional fiber lasers.

The high-energy laser 102 can also find use in remote laser welding, cutting, drilling, or heat treating operations, such as in industrial or other automation settings. The use of a high-power and high-beam quality system 100 allows the processing of thicker materials to occur at larger working distances from the system 100 while minimizing the heat-affected zone and maintaining vertical or other cut lines. Among other things, this helps to support welding or cutting operations where proximity to the weld or cut site is difficult or hazardous. It also helps to protect the system 100 and possibly any human operators from smoke, debris, or other harmful materials.

The high-energy laser 102 can further find use in construction and demolition operations. Example operations can include metal resurfacing or deslagging, paint removal, and industrial demolition operations. The high-energy laser 102 can be used to ablate material much faster and safer compared to conventional operations. As a particular example of this functionality, the high-energy laser 102 can be used to support demolition of nuclear reactors or other hazardous structures. Here, the high-energy laser 102 can be used to cut through contaminated structures like contaminated concrete or nuclear containment vessels or reactors from long distances. This helps to avoid the use of water jet cutting or other techniques that create hazardous waste, such as contaminated water. It also provides improved safety since human operators can remain farther away from contaminated structures being demolished.

A number of additional applications are possible. For example, the high-energy laser 102 can find use in power beaming applications, where high-power laser beams 104 are targeted to photovoltaic (solar) cells of remote devices to be recharged. The high-energy laser 102 can also find use in hazardous material (HAZMAT) applications, where the laser 102 is used to heat and decompose hazardous materials into less harmful or non-harmful materials. Note that all of the above applications are for illustration only and do not limit this disclosure to any particular applications of the system 100.

The laser 102 is typically contained within a housing 106. The housing 106 generally encases and protects the components of the laser 102. The housing 106 also typically includes an opening, window, or other structural feature that allows passage of the beam 104 from the laser 102 out of the housing 106. The housing 106 can be formed from any suitable material(s) and in any suitable manner. The housing 106 can also have any suitable size, shape, and dimensions.

A laser controller 108 generally controls the operation of the laser 102. For example, the laser controller 108 can control whether the laser 102 is actively generating the beam 104 or is in a standby state ready to generate the beam 104. The laser controller 108 can also control whether the laser 102 is generating a continuous beam 104 or an intermittent beam 104 and the power/energy level of the beam 104. The laser controller 108 includes any suitable structure for controlling operation of a laser 102. For instance, the laser controller 108 can include one or more processing devices, such as one or more microprocessors, microcontrollers, digital signal processors, field programmable gate arrays, application specific integrated circuits, or discrete logic devices. The laser controller 108 can also include one or more memories configured to store instructions or data used, generated, or collected by the processing device(s). The laser controller 108 can further include one or more interfaces configured to facilitate communications with other components or systems. Note that while the laser controller 108 is shown here as being separate from the laser 102, the laser controller 108 can be incorporated into the laser 102 in FIG. 1.

In the example shown in FIG. 1, the laser 102 is surrounded by one or more laser damage detection mechanisms 110. As described in more detail below, each laser damage detection mechanism 110 includes at least one conductive trace in, on, or over a substrate. The substrate represents a thin film, a fabric, a wall panel, or other suitable structure configured to be positioned around or near the laser 102. For example, wall panels incorporating the laser damage detection mechanisms 110 can be mounted on walls of a laboratory, test area, or other area in which the laser 102 is being tested or otherwise used. As another example, films incorporating the laser damage detection mechanisms 110 can be placed around the laser 102 and conformed to walls of the housing 106 or walls of a laboratory, test area, or other area.

Each laser damage detection mechanism 110 also includes at least one LED or other feedback device configured to generate visual feedback or other feedback. The conductive trace(s) of each laser damage detection mechanism 110 can form an electrical circuit with the associated LED(s) or other feedback device(s). If the high-energy beam 104 (or a portion thereof) strikes a laser damage detection mechanism 110, the energy in the beam 104 can burn through at least one conductive trace of the laser damage detection mechanism 110, which interrupts or alters an electrical circuit formed using that conductive trace. In some embodiments, when a laser damage detection mechanism 110 is undamaged, its LED or other feedback device generates feedback to indicate no laser damage has occurred. When damage occurs to the conductive trace(s) of a laser damage detection mechanism 110, its LED or other feedback device stops generating feedback to indicate that laser damage has occurred.

Moreover, control feedback associated with the electrical circuit formed using one or more laser damage detection mechanisms 110 can be provided to the laser controller 108. For example, a sensor (such as a current sensing or measuring device) can be used to detect a loss of current flowing through the laser damage detection mechanism 110 or to detect a change in the current flowing through the laser damage detection mechanism 110. If and when damage occurs to a laser damage detection mechanism 110, the laser controller 108 can detect the interruption or alteration of the current caused by the damage using the control feedback. The laser controller 108 can therefore use this control feedback to determine whether a fault has occurred, automatically shut down the laser 102 using a safety interlock function, trigger an alarm, or perform any other suitable function.

In some embodiments, the laser controller 108 can receive control feedback associated with each individual laser damage detection mechanism 110. In other embodiments, multiple laser damage detection mechanisms 110 can be coupled together, such as in series, and the laser controller 108 can receive control feedback associated with the group of laser damage detection mechanisms 110. In particular embodiments, multiple laser damage detection mechanisms 110 can be coupled together in series, and each laser damage detection mechanism 110 can include a bypass mechanism. Each bypass mechanism allows current to flow through a laser damage detection mechanism 110 even when at least one conductive trace of the laser damage detection mechanism 110 has been interrupted. This allows the LED or other feedback device of the damaged detection mechanism 110 to stop working (allowing personnel to identify the damaged detection mechanism 110) while allowing the current to flow through the other laser damage detection mechanisms 110. In some embodiments, this also allows the current flowing through the entire collection of laser damage detection mechanisms 110 to be sensed or measured, which allows the laser controller 108 to detect damage to one or more of the laser damage detection mechanisms 110 based on changes in the current.

Each laser damage detection mechanism 110 includes any suitable structure containing at least one conductive trace that can be damaged or otherwise interrupted by laser energy. Each conductive trace can be formed from any suitable conductive material(s), such as copper or aluminum. Each conductive trace can also be formed in any suitable manner, such as 3D printing onto a substrate or by depositing conductive material and patterning/etching the conductive material.

As shown in FIG. 2, the system 200 includes a high-energy laser 202, which generally operates to produce at least one high-energy laser beam 204. The laser 202 is typically contained within a housing 206, and a laser controller 208 generally controls the operation of the laser 202. These components 202-208 can be the same as or similar to the corresponding components 102-108 described above. Note that while the laser controller 208 is shown here as being separate from the laser 202, the laser controller 208 can be incorporated into the laser 202 in FIG. 2.

The system 200 also includes one or more laser damage detection mechanisms 210, each of which can include at least one conductive trace in, on, or over a substrate as described above. In this example, however, the laser damage detection mechanisms 210 are positioned inside or incorporated into the housing 206 of the system 200. For example, the laser damage detection mechanisms 210 can be implemented using one or more films, fabrics, or other small or flexible substrates that are placed on or within the housing 206. As another example, the laser damage detection mechanisms 210 can be implemented using conductive traces formed on surfaces of the housing 206 or embedded within the surfaces of the housing 206. As particular examples, the conductive traces can be formed on the surfaces of the housing 206 by using 3D printing or by depositing conductive material and patterning/etching the conductive material. As another particular example, the conductive traces can be formed as embedded traces within the housing 206 during manufacturing of the housing 206.

Each laser damage detection mechanism 210 also includes at least one LED or other feedback device that produces feedback or that does not produce feedback based on whether at least one conductive trace of the laser damage detection mechanism 210 has been damaged. This can occur in the same manner discussed above. Also, control feedback associated with the electrical circuit formed using one or more laser damage detection mechanisms 210 can be provided to the laser controller 208, and the laser controller 208 uses the control feedback to determine whether a fault has occurred or to automatically shut down the laser 202 using a safety interlock function. Again, this can occur in the same manner discussed above.

In some embodiments, the laser controller 208 can receive control feedback associated with each individual laser damage detection mechanism 210. In other embodiments, multiple laser damage detection mechanisms 210 can be coupled together, such as in series, and the laser controller 208 can receive control feedback associated with the group of laser damage detection mechanisms 210. Again, in particular embodiments, each laser damage detection mechanism 210 can include a bypass mechanism that allows current to flow through a laser damage detection mechanism 210 even when at least one conductive trace of the laser damage detection mechanism 210 has been interrupted. This allows the LED or other feedback device of the damaged detection mechanism 210 to stop working while allowing the current to flow through the other laser damage detection mechanisms 210. In some embodiments, this also allows the current flowing through the entire collection of laser damage detection mechanisms 210 to be sensed or measured, which allows the laser controller 208 to detect damage to one or more of the laser damage detection mechanisms 210 based on changes in the current.

Although FIGS. 1 and 2 illustrate two examples of systems 100 and 200 having laser damage detection mechanisms for safety interlock and fault detection, various changes may be made to FIGS. 1 and 2. For example, the lasers 102 and 202 and their associated components (such as the housings 106 and 206 and laser controllers 108 and 208) have been described here at a high level. Numerous additional features now known or later developed can be incorporated into a system that includes a laser and that uses at least one laser damage detection mechanism to detect stray beam energy.

Figure 3:
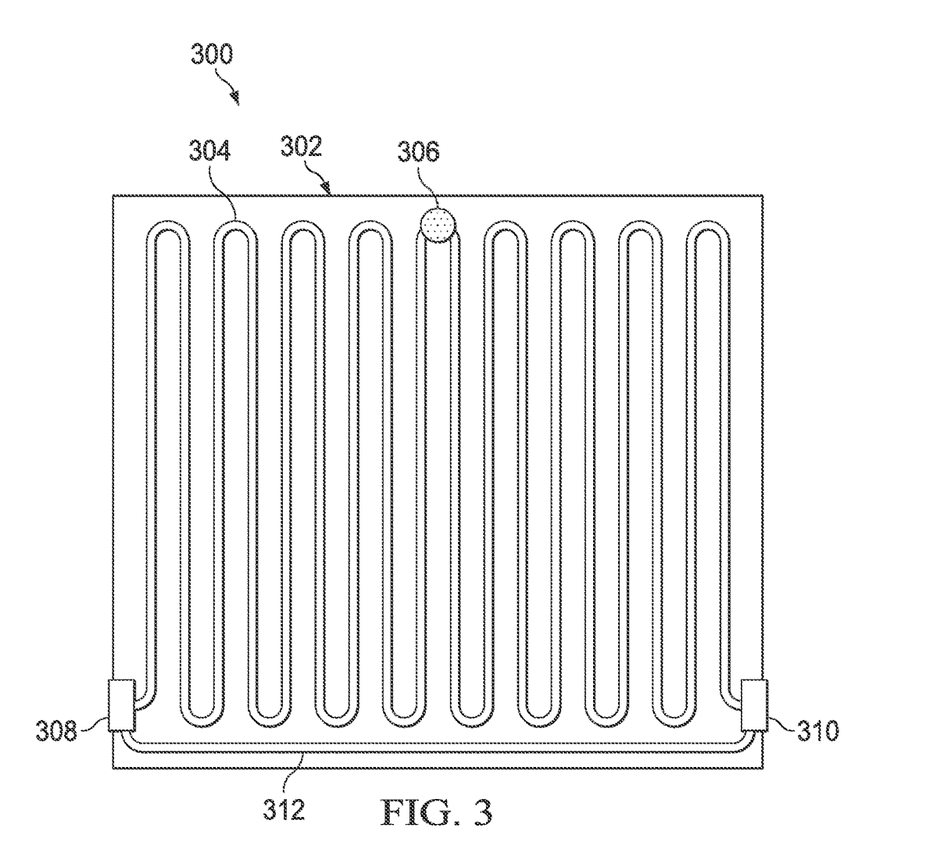
FIG. 3 illustrates an example laser damage detection mechanism for safety interlock and fault detection in accordance with this disclosure.

FIG. 3 illustrates an example laser damage detection mechanism 300 for safety interlock and fault detection in accordance with this disclosure. The laser damage detection mechanism 300 can, for example, be used in the systems 100 and 200 of FIGS. 1 and 2. However, the laser damage detection mechanism 300 can be used in any other suitable system to detect stray beam energy.

As shown in FIG. 3, the laser damage detection mechanism 300 includes a substrate 302 and at least one first conductive trace 304. The substrate 302 generally represents any suitable structure that carries at least the first conductive trace 304. In some embodiments, the first conductive trace 304 can be formed on or over an outer surface of the substrate 302, such as by using 3D printing or patterning/etching. In other embodiments, the first conductive trace 304 can be formed within the substrate 302. The substrate 302 includes any suitable structure that includes or carries at least one conductive trace, such as a polyimide film (like KAPTON), a fabric, a wall panel, or at least a portion of a graphite, aluminum, plastic, or steel laser housing.

The first conductive trace 304 in this example travels back and forth repeatedly across the substrate 302. In some embodiments, the open or non-conductive spaces between different portions of the first conductive trace 304 are smaller than the expected beam size of a high-energy laser beam. In this particular example, the first conductive trace 304 includes vertical linear portions that are connected by semi-circular or other connecting portions on top and bottom. However, note that the specific pattern of the first conductive trace 304 shown in FIG. 3 is for illustration only, and any other suitable pattern can be used for the first conductive trace 304. For instance, the first conductive trace 304 can have horizontal linear portions that are connected by semi-circular or other connecting portions on the right and left, or the first conductive trace 304 can have horizontal, vertical, or other wavy portions that are connected by semi-circular or other connecting portions. In general, the first conductive trace 304 can have any suitable pattern that allows the first conductive trace 304 to be damaged by stray laser energy.

A feedback device (in this example at least one LED 306) is electrically coupled to the first conductive trace 304. When an electrical current flows through the first conductive trace 304, the LED 306 generates illumination. When the first conductive trace 304 is damaged and the flow of the electrical current is interrupted, the LED 306 stops generating illumination. In this way, the LED 306 provides feedback to identify whether damage has occurred to the first conductive trace 304. Each LED 306 includes any suitable structure configured to generate illumination for a laser damage detection mechanism. Note, however, that the use of a feedback device is not necessarily required.

First and second electrical connectors 308 and 310 provide for electrical connection of the laser damage detection mechanism 300 to one or more other components, and the first conductive trace 304 forms an electrical connection between the connectors 308 and 310. For example, in some embodiments, the connectors 308 and 310 can be used to couple adjacent laser damage detection mechanisms 300 in a series manner. As another example, one or both connectors 308 and 310 can be used to couple the laser damage detection mechanism 300 to a power supply or a current sensor as described in more detail below. Each connector 308 and 310 includes any suitable structure providing an electrical connection between at least one conductive trace of a laser damage detection mechanism and an external component.

Optionally, the laser damage detection mechanism 300 can include a second conductive trace 312, which may be referred to as a "bypass" trace or path. The second conductive trace 312 forms another electrical connection between the connectors 308 and 310. If and when the first conductive trace 304 is damaged by stray laser energy (or in any other manner), electrical current can be redirected from the first conductive trace 304 to the second conductive trace 312. As a result, damage to the first conductive trace 304 causes the LED 306 to stop illuminating, but current can flow through the laser damage detection mechanism 300 via the second conductive trace 312. This may allow, for example, multiple laser damage detection mechanisms 300 to be used in series, where a failure of the first conductive trace 304 in one laser damage detection mechanism 300 is bypassed so that the LEDs 306 in the other laser damage detection mechanisms 300 can generate illumination.

The second conductive trace 312 can be formed from any suitable conductive material(s), such as copper or aluminum. The second conductive trace 312 can also be formed in any suitable manner, such as by 3D printing onto a substrate or by depositing conductive material and patterning/etching the conductive material.

In order to support the ability of the second conductive trace 312 to bypass a failed first conductive trace 304, one or both connectors 308 and 310 can support a mechanism that redirects electrical current onto the second conductive trace 312. For example, in some embodiments, one or both connectors 308 and 310 can include a shunt wire that is coated with an insulator (such as an oxide). Upon a failure of the first conductive trace 304, a voltage buildup can burn through or melt the insulation of the shunt wire, causing the shunt wire to become much more conductive. This allows the electrical current to flow over the shunt wire to the second conductive trace 312, bypassing the failed first conductive trace 304.

Note, however, that any other suitable mechanisms can be used here to allow current to flow through the second conductive trace 312. As long as the second conductive trace 312 is able to pass current when the first conductive trace 304 fails, multiple laser damage detection mechanisms 300 can be coupled in series such that one or more detection mechanisms 300 can generate illumination or other feedback even when one or more other detection mechanisms 300 fail.

Also note that there are various ways in which damage to a laser damage detection mechanism 300 can be detected. For example, the failure of a first conductive trace 304 in a laser damage detection mechanism 300 can interrupt the current flowing through an electrical circuit. Even if the current is quickly redirected onto the second conductive trace 312, the interruption of the current can be detected. As another example, an apparent change in the electrical circuit formed through a laser damage detection mechanism 300 can be detected. For instance, the second conductive trace 312 may be shorter than the first conductive trace 304 and may lack an LED or other feedback device, so the second conductive trace 312 can have a smaller resistance than the first conductive trace 304 and the LED 306. When current is redirected onto the second conductive trace 312 after the first conductive trace 304 is damaged, this can allow the current flowing through the electrical circuit to increase. This increase can be detected and used as an indication that damage has occurred to a laser damage detection mechanism 300.

Although FIG. 3 illustrates one example of a laser damage detection mechanism 300 for safety interlock and fault detection, various changes may be made to FIG. 3. For example, the laser damage detection mechanism 300 can have any suitable size, shape, and dimensions. Also, each of the conductive traces 304 and 312 can have any suitable pattern. Further, the laser damage detection mechanism 300 can include any suitable number of each component.

In addition, while the laser damage detection mechanism 300 has been described as having a single substrate 302 and a single first conductive trace 304, other embodiments of the laser damage detection mechanism 300 can also be used. For instance, in other embodiments, a laser damage detection mechanism 300 can include multiple substrates 302 that are stacked on top of each other, or separate laser damage detection mechanisms 300 can be stacked on top of each other. At least two of the substrates 302 can include different first conductive traces 304 having different patterns, such as when one substrate has the same pattern as another substrate but the pattern is rotated by some angle (such as 90°). This stacking may allow each individual substrate 302 to have open or non-conductive spaces (spaces without a first conductive trace) larger than the expected size of the beam energy, while the collection of substrates 302 has open or non-conductive spaces smaller than the expected size of the beam energy. Separate LEDs 306 and conductive traces 312 can also be provided for each substrate 302.

Figure 4:
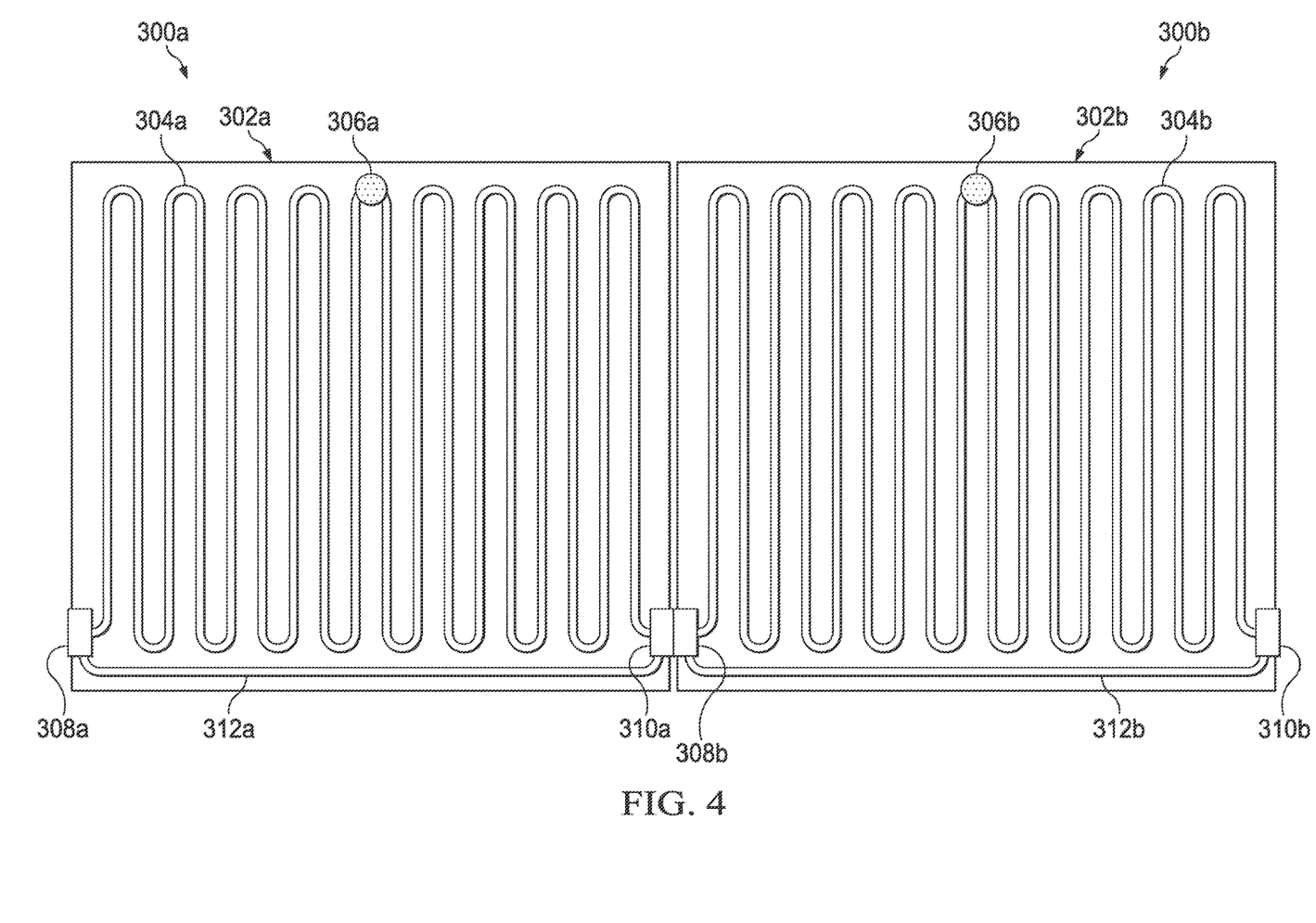
FIGS. 4 and 5 illustrate an example use of laser damage detection mechanisms for safety interlock and fault detection in accordance with this disclosure.
Figure 5:
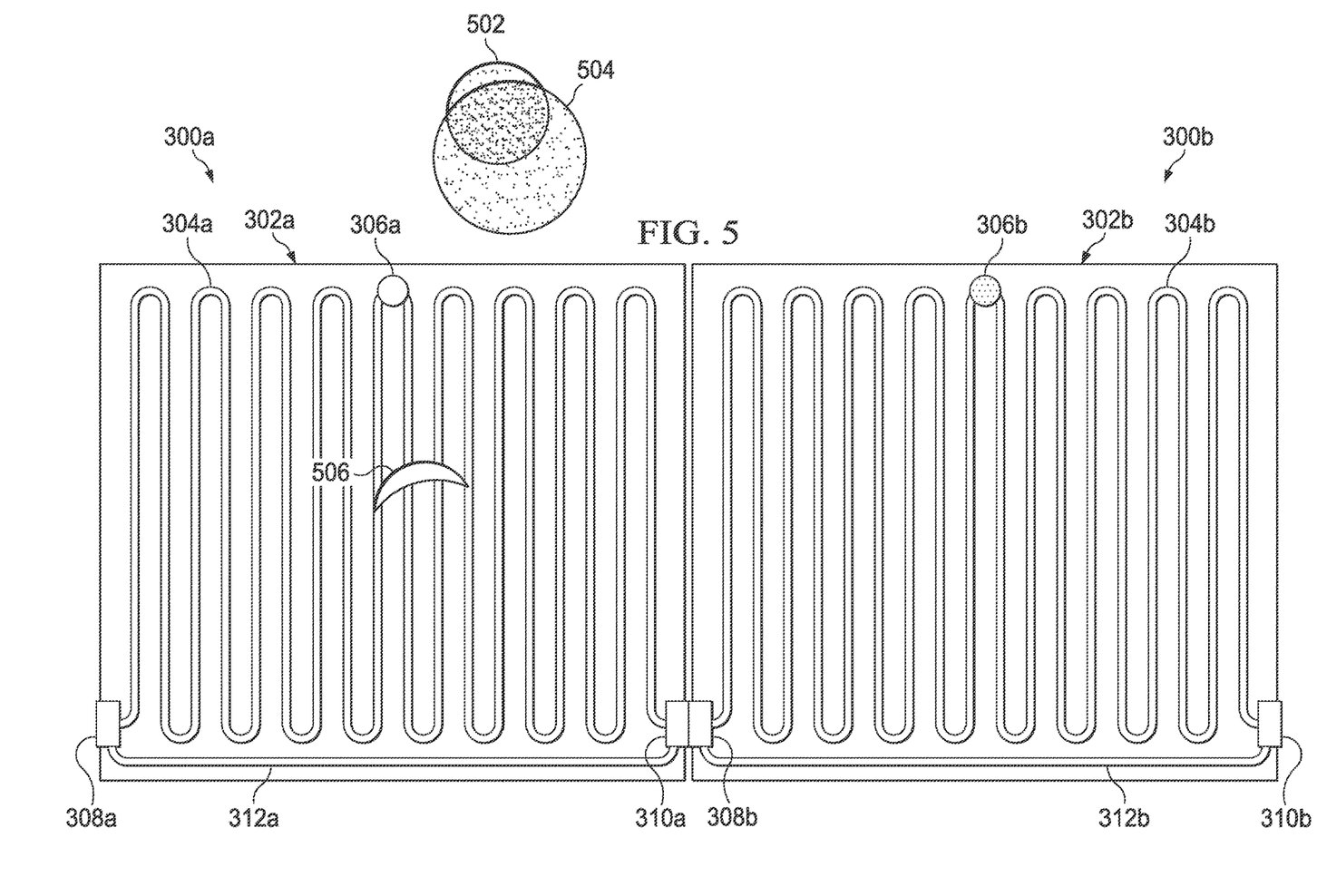

FIGS. 4 and 5 illustrate an example use of laser damage detection mechanisms for safety interlock and fault detection in accordance with this disclosure. For ease of explanation, the laser damage detection mechanism 300 of FIG. 3 is used in FIGS. 4 and 5. However, the use of the laser damage detection mechanism 300 shown in FIGS. 4 and 5 is for illustration only. The laser damage detection mechanism 300 can be used in any other suitable manner.

As shown in FIG. 4, multiple instances of the laser damage detection mechanism 300 (referred to respectively as first and second laser damage detection mechanisms 300a and 300b) are coupled in series. The first laser damage detection mechanism 300a includes a first substrate 302a, a first conductive trace 304a, a first LED 306a, first and second connectors 308a and 310a, and a second conductive trace 312a. The second laser damage detection mechanism 300b includes a second substrate 302b, a third conductive trace 304b, a second LED 306b, third and fourth connectors 308b and 310b, and a fourth conductive trace 312b.

The second connector 310a of the first laser damage detection mechanism 300a connects to the third connector 308b of the second laser damage detection mechanism 300b. Thus, the first conductive trace 304a or the second conductive trace 312a can be electrically connected to the third conductive trace 304*b* or the fourth conductive trace 312*b* through the second connector 310*a* and the third connector 308*b*. In FIG. 4, when both laser damage detection mechanisms 300*a*-300*b* are undamaged, an electrical current can flow through both the first conductive trace 304*a* and the third conductive trace 304*b*. As a result, both LEDs 306*a* and 306*b* generate illumination as shown in FIG. 4.

In FIG. 5, a laser beam 502 (which might represent either of the high-energy beams 104 and 204) has been directed towards a mirror or other optical element 504 in a laser system. However, the beam 502 has moved somewhat off the optical element 504, which is typically referred to as "beam walking." A portion of the beam 502 therefore strays and strikes the first laser damage detection mechanism 300*a* in this example, forming a cut 506 partially or completely through the first laser damage detection mechanism 300*a*. This cut 506 damages the first conductive trace 304*a* and interrupts the electrical circuit formed using the first conductive trace 304*a*. As a result, the LED 306*a* of the first laser damage detection mechanism 300*a* stops generating illumination, thereby providing visual feedback identifying the first laser damage detection mechanism 300*a* as being damaged.

As described above, in some embodiments, the connector 308*a* of the first laser damage detection mechanism 300*a* can include a shunt wire wrapped in insulation. Similar structures can be used in any or all of the connectors 308*b*, 310*a*, 310*b*. When the first conductive trace 304*a* is cut, the voltage on the connector 308*a* causes the insulation to burn away or melt, forming an effective electrical connection to the second conductive trace 312*a*. Thus, electrical current can flow from the connector 308*a* to the connector 310*a* through the second conductive trace 312*a*. In the absence of damage to the second laser damage detection mechanism 300*b*, the electrical current then flows through the third conductive trace 304*b*, causing the LED 306*b* to generate illumination. This approach allows the LED 306*a* of the damaged laser damage detection mechanism 300*a* to stop generating illumination, while the LED 306*b* of the undamaged laser damage detection mechanism 300*b* can continue generating illumination. This provides an easy mechanism for identifying damaged detection mechanisms.

Although FIGS. 4 and 5 illustrate one example use of laser damage detection mechanisms for safety interlock and fault detection, various changes may be made to FIGS. 4 and 5. For example, a single laser damage detection mechanism 300 can be used here, or multiple laser damage detection mechanisms 300 in any suitable arrangement can be used here. Also, the laser damage detection mechanisms 300 can be used with any suitable laser that produces any suitable beam. In addition, the laser damage detection mechanisms 300 can be damaged in other ways besides a beam walking off a mirror.

Figure 6:
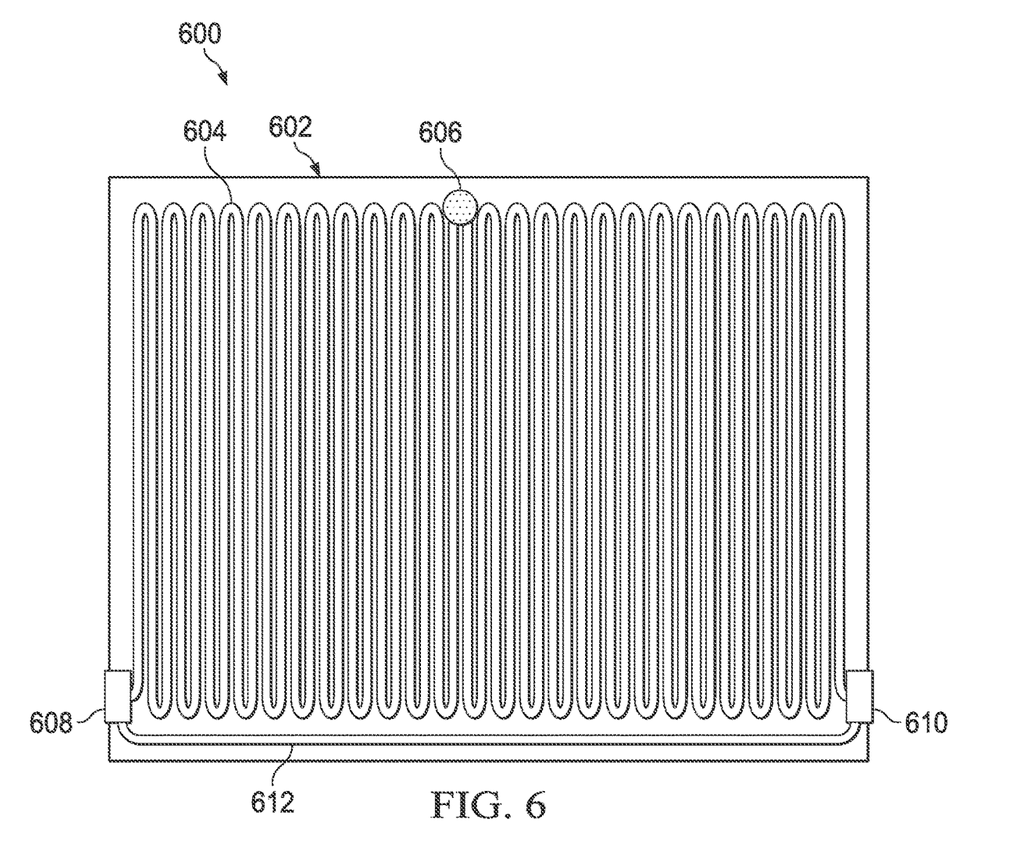
FIG. 6 illustrates another example laser damage detection mechanism for safety interlock and fault detection in accordance with this disclosure.

FIG. 6 illustrates another example laser damage detection mechanism 600 for safety interlock and fault detection in accordance with this disclosure. The laser damage detection mechanism 600 here includes a substrate 602, a first conductive trace 604, an LED 606, first and second electrical connectors 608 and 610, and a second conductive trace 612. These components 602-612 can be the same as or similar to the corresponding components 302-312 described above, except the first conductive trace 604 here has a different pattern. Namely, in this example, the first conductive trace 604 has a smaller trace pattern, so the open or non-conductive spaces between portions of the first conductive trace 604 are smaller than the open or non-conductive spaces between portions of the first conductive trace 304. The pattern in FIG. 6 may be needed or desired when the size of the stray beam energy striking the laser damage detection mechanism 600 is expected to be smaller compared to the laser damage detection mechanism 300.

Note that multiple instances of the laser damage detection mechanism 600 can be used independently or can be coupled together in the manner shown in FIGS. 4 and 5. Also note that different laser damage detection mechanisms having different designs can be used independently or together in the same system. For example, laser damage detection mechanisms having larger spaces can be coupled to laser damage detection mechanisms having smaller spaces as needed or desired. In general, any number of laser damage detection mechanisms can be used independently or together, and each laser damage detection mechanism can have any suitable pattern for its first conductive trace. Different laser damage detection mechanisms may or may not have different patterns for their conductive traces.

Although FIG. 6 illustrates another example of a laser damage detection mechanism 600 for safety interlock and fault detection, various changes may be made to FIG. 6. For example, the laser damage detection mechanism 600 can have any suitable size, shape, and dimensions. Also, each of the conductive traces 604 and 612 can have any suitable pattern. Further, the laser damage detection mechanism 600 can include any suitable number of each component, and the feedback device may or may not be included.

In addition, while the laser damage detection mechanism 600 has been described as having a single substrate 602 and a single first conductive trace 604, other embodiments of the laser damage detection mechanism 600 can also be used. For instance, in other embodiments, a laser damage detection mechanism 600 can include multiple substrates 602 that are stacked on top of each other, or separate laser damage detection mechanisms 600 can be stacked on top of each other. At least two of the substrates 602 can include different first conductive traces 604 having different patterns, such as when one substrate has the same pattern as another substrate but the pattern is rotated by some angle (such as 90°). This stacking may allow each individual substrate 602 to have open or non-conductive spaces larger than the expected size of the beam energy, while the collection of substrates 602 has open or non-conductive spaces smaller than the expected size of the beam energy. Separate LEDs 606 and conductive traces 612 can also be provided for each substrate 602.

Figure 7A:
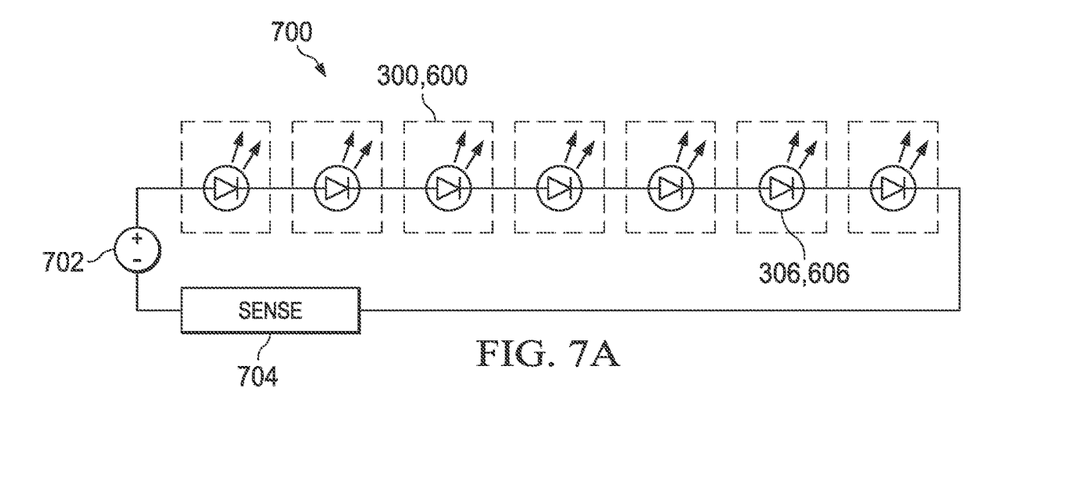
FIGS. 7A through 7C illustrate example electrical circuits formed using laser damage detection mechanisms in accordance with this disclosure.
Figure 7B:
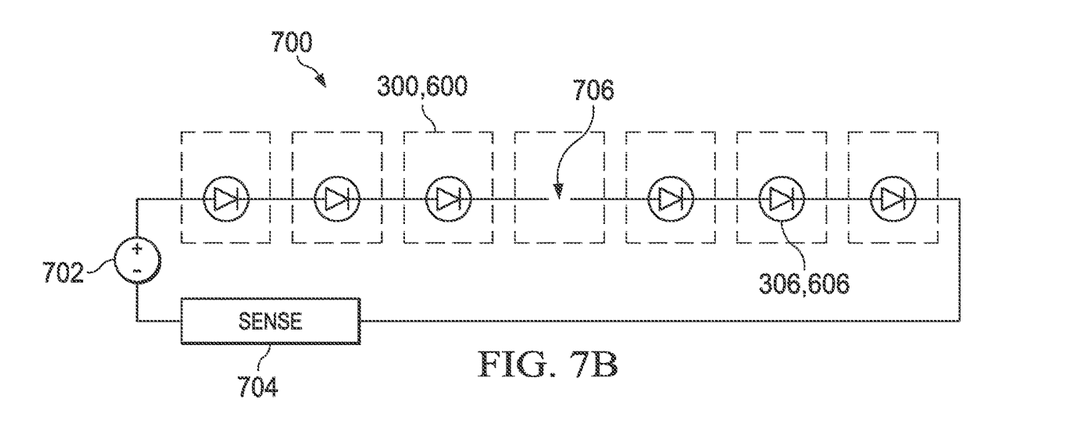
Figure 7C:
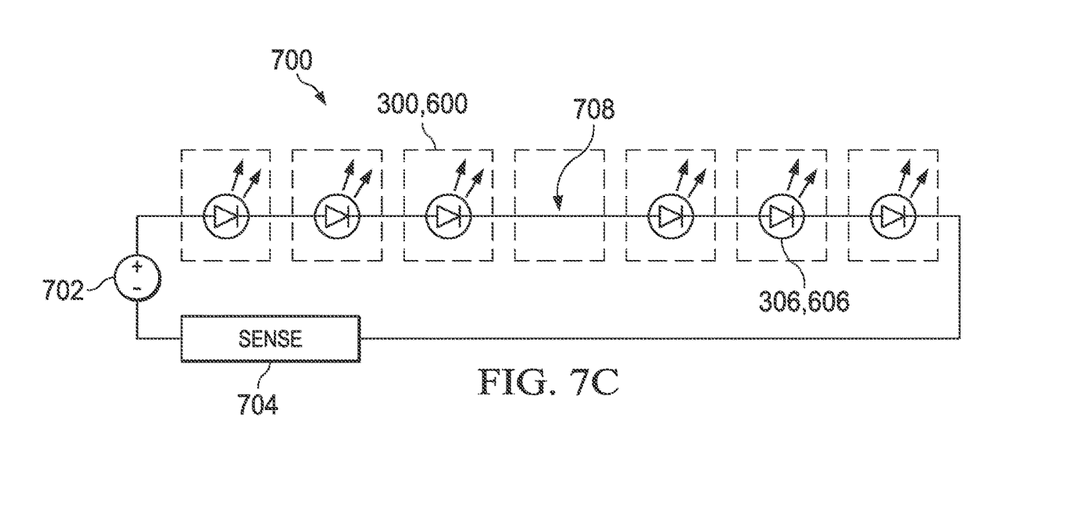

FIGS. 7A through 7C illustrate example electrical circuits formed using laser damage detection mechanisms in accordance with this disclosure. In particular, the electrical circuits shown in FIGS. 7A through 7C can be formed by the conductive traces of multiple laser damage detection mechanisms (such as one or both of the laser damage detection mechanisms 300 or 600).

As shown in FIG. 7A, multiple laser damage detection mechanisms 300 or 600 are coupled in series. This can be accomplished by attaching the connector 310 or 610 (shown in FIGS. 3 and 6, respectively) of one laser damage detection mechanism 300 or 600 to the connector 308 or 608 (shown in FIGS. 3 and 6, respectively) of a subsequent laser damage detection mechanism 300 or 600. The first laser damage detection mechanism 300 or 600 is coupled to a power supply 702, such as by coupling the connector 308 or 608 of the first laser damage detection mechanism 300 or 600 to the power supply 702. The last laser damage detection mechanism 300 or 600 is coupled to a current sensor 704, such as by coupling the connector 310 or 610 of the last laser damage detection mechanism 300 or 600 to the current sensor 704.

The power supply 702 represents any suitable source of electrical current that can flow through an electrical circuit 700, such as a direct current (DC) or alternating current (AC) power supply. The current sensor 704 represents any suitable structure configured to detect the presence (and optionally measure the amount) of current flowing through the electrical circuit 700. Outputs of the current sensor 704 can be provided to a laser controller 108 or 208 (shown in FIGS. 1 and 2, respectively) so that the laser controller 108 or 208 can determine if and when the flow of current detected by the current sensor 704 is interrupted or changes (possibly indicating that a fault has occurred).

In FIG. 7A, all of the laser damage detection mechanisms 300 or 600 are undamaged, so the electrical circuit 700 is intact. Current flows from the power supply 702 through the first conductive trace 304 or 604 (shown in FIGS. 3 and 6, respectively) of each laser damage detection mechanism 300 or 600. As a result, all LEDs 306 or 606 of the laser damage detection mechanisms 300 or 600 generate illumination. Also, the current sensor 704 can detect the current flowing through the electrical circuit 700 and optionally measure a generally-steady amount of current flowing through the electrical circuit 700.

In FIG. 7B, one of the laser damage detection mechanisms 300 or 600 has been damaged, creating an open circuit 706. This condition occurs after the first conductive trace 304 or 604 of the damaged detection mechanism 300 or 600 has been cut but before the current is rerouted over the second conductive trace 312 or 612 (shown in FIGS. 3 and 6, respectively) of the damaged detection mechanism 300 or 600. The current sensor 704 can detect the interruption of the current and generate one or more outputs for the laser controller 108 or 208. The laser controller 108 or 208 can use the output(s) to detect a fault and shut down the laser 102 or 202 (shown in FIGS. 1 and 2, respectively). Since the open circuit 706 can be detected very quickly, this process helps achieve ultra-fast shutdown of the laser 102 or 202.

In FIG. 7C, the first conductive trace 304 or 604 of the damaged detection mechanisms 300 or 600 remains damaged, but the open circuit 706 has been replaced by a bypass connection 708. The bypass connection 708 is formed by the second conductive trace 312 or 612 in the damaged detection mechanism 300 or 600. The formation of the bypass connection 708 allows the LEDs 306 or 606 in the other laser damage detection mechanisms 300 or 600 to generate illumination, while the LED 306 or 606 in the damaged detection mechanism 300 or 600 can remain off. As a result, personnel can easily identify the damaged detection mechanism 300 or 600.

Note that while the current sensor 704 in FIG. 7C can again detect an electrical current in this state, a shutdown of the laser 102 or 202 may have already been initiated by the laser controller 108 or 208 in response to the open circuit 706. Alternatively, the condition in FIG. 7C can be detected by the laser controller 108 or 208, such as when the damaged detection mechanism 300 or 600 has a shorter conductive pathway without an LED that reduces the overall resistance in the electrical circuit. This condition can be detected by the laser controller 108 or 208, which can detect a fault and shut down the laser 102 or 202.

Although FIGS. 7A through 7C illustrate examples of electrical circuits formed using laser damage detection mechanisms, various changes may be made to FIGS. 7A through 7C. For example, as noted above, the laser damage detection mechanisms 300 or 600 can be arranged in various ways and need not necessarily be arranged in series to form a single electrical circuit. Other arrangements of laser damage detection mechanisms 300 or 600 are also possible, including those in which single laser damage detection mechanisms 300 or 600 are used and coupled directly or indirectly to a laser controller 108 or 208. Also, the components in FIGS. 7A through 7C can be rearranged, such as when the current sensor 704 is positioned between two laser damage detection mechanisms 300 or 600. In addition, any other suitable mechanism(s) can be used to sense changes to one or more voltages, currents, or other electrical characteristics within the electrical circuits.

Figure 8:
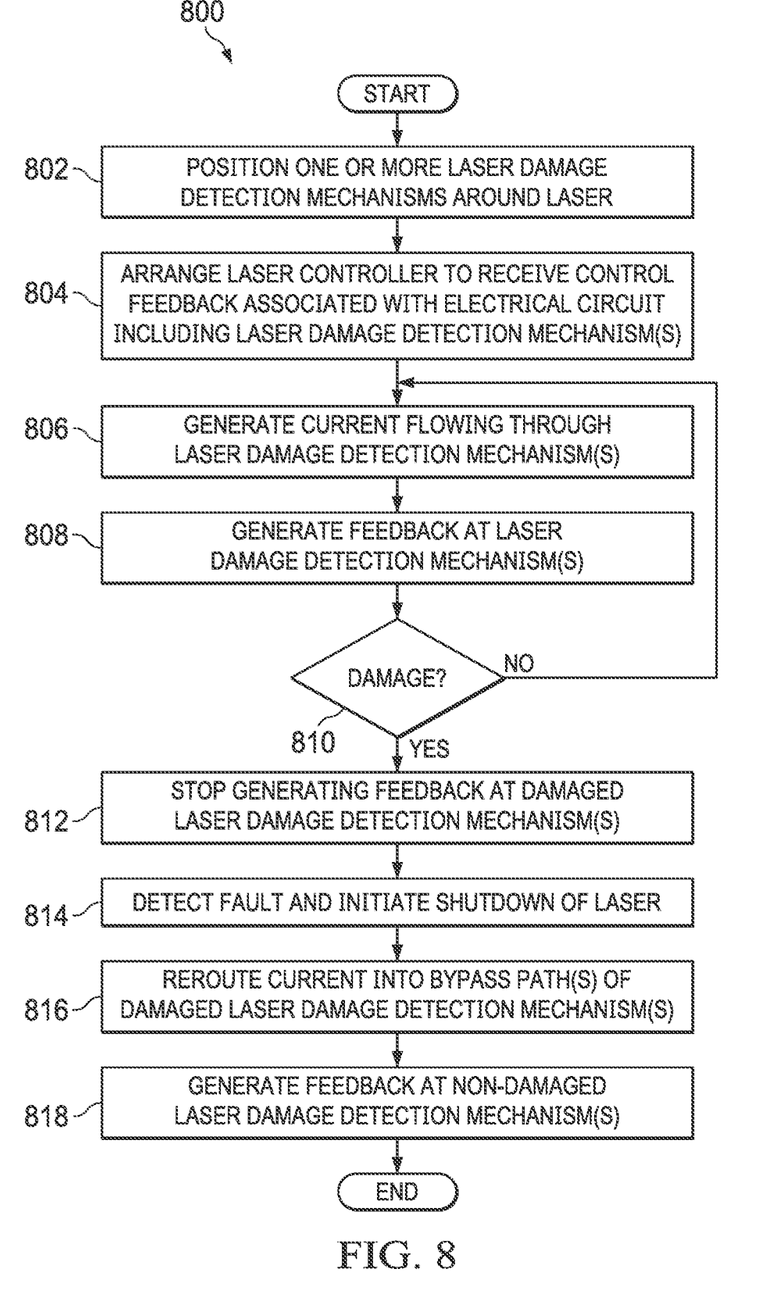
FIG. 8 illustrates an example method of using one or more laser damage detection mechanisms for safety interlock and fault detection in accordance with this disclosure.

FIG. 8 illustrates an example method 800 of using one or more laser damage detection mechanisms for safety interlock and fault detection in accordance with this disclosure. For ease of explanation, the method 800 is described as involving the use of one or more laser damage detection mechanisms 300 or 600 of FIG. 3 or 6 in the system 100 or 200 of FIG. 1 or 2. However, the method 800 can involve the use of any suitable laser damage detection mechanism(s) in any suitable system.

As shown in FIG. 8 and referring to FIGS. 7A through 7C unless specified otherwise, one or more laser damage detection mechanisms are positioned around a laser at step 802, and a laser controller is arranged to receive control feedback associated with an electrical circuit that includes the laser damage detection mechanism(s) at step 804. This can include, for example, installing one or more films, fabrics, wall panels, or other substrates carrying or including conductive traces around the laser 102 (shown in FIG. 1). This can also include placing a housing 206 carrying or including conductive traces around the laser 202 (both shown in FIG. 2). This can optionally further include coupling multiple laser damage detection mechanisms 300 or 600 in series. In addition, this can include coupling a current sensor 704 or other suitable sensor (in series or otherwise) to the laser damage detection mechanism(s) 300 or 600 and to a laser controller 108 or 208 (shown in FIGS. 1 and 2, respectively).

During operation, at least one current flows through the laser damage detection mechanism(s) at step 806. This can include, for example, current from the power supply 702 passing through the first conductive trace(s) 304 or 604 (shown in FIGS. 3 and 6, respectively) of the laser damage detection mechanism(s) 300 or 600. Feedback is generated at the laser damage detection mechanism(s) at step 808. This can include, for example, the current passing through the first conductive trace(s) 304 or 604 and causing the LED(s) 306 or 606 to generate illumination. As long as no damage occurs to the laser damage detection mechanism(s) 300 or 600 at step 810, the process can continue to repeat steps 806 and 808.

If and when damage occurs to at least one laser damage detection mechanism at step 810, the damaged detection mechanism(s) 300 or 600 stop(s) generating feedback at step 812, and a fault is detected and shutdown of the laser is initiated at step 814. This can include, for example, the LED 306 or 606 of the damaged detection mechanism(s) 300 or 600 no longer generating illumination. This can also include the laser controller 108 or 208 detecting an interruption or alteration of the current flowing through the laser damage detection mechanism(s) 300 or 600 based on the output(s) from the current sensor 704 or other control feedback. This can further include the laser controller 108 or 208 causing the laser 102 or 202 to shut down, redirecting a high-energy beam 104 or 204 (shown in FIGS. 1 and 2, respectively) to a beam dump, or performing other functions.

The current can be rerouted into a bypass path of each damaged detection mechanism at step 816. This can include, for example, shunting incoming current received at a connector 308, 310, 608, or 610 (shown in FIGS. 3 and 6, respectively) from the first conductive trace 304 or 604 of the damaged detection mechanism(s) 300 or 600 to the second conductive trace 312 or 612 (shown in FIGS. 3 and 6, respectively) of the damaged detection mechanism(s) 300 or 600. As a result, feedback can be generated at any non-damaged detection mechanism(s) at step 818. This can include, for example, the LED 306 or 606 of each non-damaged detection mechanism 300 or 600 generating illumination. Among other things, shutdown of the laser 102 or 202 can be initiated rapidly, and the damaged detection mechanism(s) 300 or 600 can be easily identified by the lack of illumination from the associated LED(s) 306 or 606.

Although FIG. 8 illustrates one example of a method 800 of using one or more laser damage detection mechanisms for safety interlock and fault detection, various changes may be made to FIG. 8. For example, while shown as a series of steps, various steps in FIG. 8 can overlap, occur in parallel, occur in a different order, or occur any number of times. Also, various steps in FIG. 8 can be omitted if desired, such as when steps 816-818 are omitted when bypassing is not required (like when one or more laser damage detection mechanisms are used individually and are not coupled together in series).

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
   a substrate;
   first and second electrical connectors;
   at least one first conductive trace positioned in, on, or over the substrate, wherein the at least one first conductive trace forms an electrical connection between the first and second electrical connectors, wherein the at least one first conductive trace is configured to be damaged by laser energy to break the electrical connection between the first and second electrical connectors; and
   an illumination-generating indicator electrically coupled in series with the at least one first conductive trace, wherein the illumination-generating indicator is configured to generate illumination when the electrical connection between the first and second electrical connectors is intact and to stop generating the illumination when the electrical connection between the first and second electrical connectors has been broken.

2. The apparatus of claim 1, further comprising:
   a second conductive trace positioned in, on, or over the substrate;
   wherein the second conductive trace forms an additional electrical connection between the first and second electrical connectors and is configured to transport an electrical current between the first and second electrical connectors.

3. The apparatus of claim 2, wherein at least one of the first and second electrical connectors is configured to shunt the electrical current from the at least one first conductive trace to the second conductive trace upon breaking of the electrical connection between the first and second electrical connectors.

4. The apparatus of claim 1, wherein the substrate is flexible and is configured to be conformed to at least one surface around a laser.

5. The apparatus of claim 1, wherein the substrate comprises one of: a film, a fabric, a wall panel, and a housing of a laser.

6. The apparatus of claim 1, wherein the at least one first conductive trace extends back and forth repeatedly across the substrate.

7. The apparatus of claim 1, wherein open or non-conductive spaces between portions of the at least one first conductive trace are smaller than an expected beam size of a laser.

8. The apparatus of claim 1, wherein the illumination-generating indicator comprises a light emitting diode.

9. A system comprising:
   one or more laser damage detectors each configured to detect stray laser energy from a laser, each laser damage detector comprising:
   a substrate;
   first and second electrical connectors;
   at least one first conductive trace positioned in, on, or over the substrate, wherein the at least one first conductive trace forms an electrical connection between the first and second electrical connectors, wherein the at least one first conductive trace is configured to be damaged by the stray laser energy to break the electrical connection between the first and second electrical connectors; and
   an illumination-generating indicator electrically coupled in series with the at least one first conductive trace, wherein the illumination-generating indicator is configured to generate illumination when the electrical connection between the first and second electrical connectors is intact and to stop generating the illumination when the electrical connection between the first and second electrical connectors has been broken; and a laser controller configured to shut down operation of the laser in response to breaking of the electrical connection between the first and second electrical connectors in at least one of the one or more laser damage detectors.

10. The system of claim 9, wherein, in each laser damage detector:
the laser damage detector further comprises a second conductive trace positioned in, on, or over the substrate; and
the second conductive trace forms an additional electrical connection between the first and second electrical connectors and is configured to transport an electrical current between the first and second electrical connectors.

11. The system of claim 10, wherein, in each laser damage detector, at least one of the first and second electrical connectors is configured to shunt the electrical current from the at least one first conductive trace to the second conductive trace upon breaking of the electrical connection between the first and second electrical connectors.

12. The system of claim 10, wherein:
multiple laser damage detectors are coupled in series; and
the illumination-generating indicator of each undamaged laser damage detector is configured to generate the illumination after the illumination-generating indicator of each damaged laser damage detector has stopped generating the illumination.

13. The system of claim 9, wherein, in each laser damage detector, the substrate is flexible and is configured to be conformed to at least one surface around the laser.

14. The system of claim 9, wherein, in each laser damage detector, the substrate comprises one of: a film, a fabric, a wall panel, and a housing of the laser.

15. The system of claim 9, further comprising:
a power supply configured to provide electrical current to the one or more laser damage detectors; and
a current sensor configured to sense or measure the electrical current flowing through the one or more laser damage detectors.

16. The system of claim 15, wherein the laser controller is configured, based on one or more outputs of the current sensor, to shut down the operation of the laser in response to an interruption or a change in the electrical current flowing through the one or more laser damage detectors.

17. A method comprising:
passing an electrical current through at least one first conductive trace of a laser damage detector, the at least one first conductive trace positioned in, on, or over a substrate, the at least one first conductive trace forming an electrical connection between first and second electrical connectors;

generating illumination by an illumination-generating indicator electrically coupled in series with the at least one first conductive trace as the electrical current passes through the electrical connection between the first and second electrical connectors; and in response to damage of the at least one first conductive trace by laser energy, stopping generation of the illumination by the illumination-generating indicator, wherein the damage breaks the electrical connection between the first and second electrical connectors.

18. The method of claim 17, further comprising:
in response to the damage of the at least one first conductive trace by the laser energy, transporting the electrical current through a second conductive trace positioned in, on, or over the substrate;
wherein the second conductive trace forms an additional electrical connection between the first and second electrical connectors of the laser damage detector.

19. The method of claim 18, wherein:
multiple laser damage detectors are coupled in series; and
the illumination-generating indicator of each undamaged laser damage detector generates the illumination after the illumination-generating indicator of each damaged laser damage detector has stopped generating the illumination.

20. The method of claim 17, further comprising:
receiving, at a laser controller, control feedback associated with an electrical circuit formed at least partially by the laser damage detector; and
using the control feedback to initiate shutdown of a laser by the laser controller in response to an interruption or a change in the electrical current flowing through the laser damage detector.

21. The method of claim 20, wherein the control feedback comprises one or more outputs from a current sensor coupled in series with the laser damage detector.

22. An apparatus comprising:
a substrate;
first and second electrical connectors;
at least one conductive trace positioned in, on, or over the substrate, wherein the at least one conductive trace forms an electrical connection between the first and second electrical connectors, wherein the at least one conductive trace is configured to be damaged by laser energy to break the electrical connection between the first and second electrical connectors; and
an illumination-generating indicator electrically coupled to the at least one conductive trace, wherein the illumination-generating indicator is configured to (i) generate illumination and (ii) stop generating the illumination when the at least one conductive trace has been damaged.

* * * * *